United States Patent [19]
Kanno

[11] Patent Number: 6,092,537
[45] Date of Patent: *Jul. 25, 2000

[54] POST-TREATMENT METHOD FOR DRY ETCHING

[75] Inventor: Itaru Kanno, Hyogo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/786,379

[22] Filed: Jan. 17, 1997

Related U.S. Application Data

[63] Continuation of application No. 08/526,474, Sep. 11, 1995, abandoned.

[30] Foreign Application Priority Data

Jan. 19, 1995 [JP] Japan ................................. 7-006474

[51] Int. Cl.⁷ .............................. B08B 6/00; H01L 21/302
[52] U.S. Cl. .............................. 134/1.2; 134/1.3; 216/92; 438/695
[58] Field of Search .................... 134/1.2, 1.3, 26; 216/92; 438/695

[56] References Cited

U.S. PATENT DOCUMENTS

| | | | |
|---|---|---|---|
| 3,739,983 | 6/1973 | Jonsson | 239/101 |
| 4,747,421 | 5/1988 | Hayashi | 134/201 |
| 5,025,597 | 6/1991 | Tada et al. | . |
| 5,074,083 | 12/1991 | Kanno et al. | 51/410 |
| 5,081,068 | 1/1992 | Endo et al. | 134/31 |
| 5,100,476 | 3/1992 | Mase et al. | 134/1 |
| 5,114,748 | 5/1992 | Tada et al. | 427/180 |
| 5,129,956 | 7/1992 | Pickering et al. | 134/15 |
| 5,171,393 | 12/1992 | Moffat | 156/345 |
| 5,174,816 | 12/1992 | Aoyama et al. | 106/203 |
| 5,181,985 | 1/1993 | Lampert et al. | 156/635 |
| 5,186,192 | 2/1993 | Netsu et al. | 134/68 |
| 5,259,888 | 11/1993 | McCoy | 134/2 |
| 5,269,878 | 12/1993 | Page et al. | 156/640 |
| 5,294,261 | 3/1994 | McDermott et al. | 134/7 |
| 5,315,793 | 5/1994 | Peterson et al. | 51/415 |
| 5,630,904 | 5/1997 | Aoyama et al. | . |
| 5,660,681 | 8/1997 | Fukuda et al. | . |
| 5,934,566 | 8/1999 | Kanno et al. | 239/398 |

FOREIGN PATENT DOCUMENTS

| | | |
|---|---|---|
| 57-145322 | 9/1982 | Japan . |
| 57-008903 | 7/1983 | Japan . |
| 60-031260 | 2/1985 | Japan . |
| 60-21526 | 2/1985 | Japan . |
| 60-043830 | 3/1985 | Japan . |
| 62-281332 | 12/1987 | Japan . |
| 2-257632 | 10/1990 | Japan . |
| 3-201432 | 9/1991 | Japan . |
| 4-48633 | 2/1992 | Japan . |
| 5-21405 | 1/1993 | Japan . |
| 5-259066 | 10/1993 | Japan . |

OTHER PUBLICATIONS

"Platinum Etching And Plasma Characteristics In RF Magnetron And Electron Resonance Plasmas"; Japanese Journal of Applied Physics, Part 1, (Regular Paper & Short Notes); Dec. 1993; vol. 32, No. 12B; Nishikawa et al, abstract only.

*Primary Examiner*—William Powell
*Assistant Examiner*—George Goudreau
*Attorney, Agent, or Firm*—McDermott, Will & Emery

[57] ABSTRACT

In order to provide a post-treatment method for dry etching which is improved to be capable of completely removing a deposit resulting from dry etching for forming a wire, a workpiece layer is formed on an underlayer oxide film which is formed on a wafer. A resist pattern having a prescribed shape is formed on the workpiece layer. The workpiece layer is dry-etched through the resist pattern serving as a mask. The resist pattern is removed. Ice particles or droplets are injected toward the wafer, thereby removing the deposit.

15 Claims, 6 Drawing Sheets

POST-TREATMENT METHOD FOR DRY ETCHING

This application is a continuation of application Ser. No. 08/526,474 filed Sep. 11, 1995, now abandoned.

BACKGROUND OF THE INVENTION

1. Field of the Invention

The present invention generally relates to a post-treatment method which is carried out after dry etching, and more specifically, it relates to a post-treatment method for dry etching, which is improved to be capable of completely removing a deposit resulting from the dry etching.

2. Description of the Background Art

In relation to semiconductor fabrication steps, there are number of steps of dry-etching various wiring materials through resist masks.

FIGS. 9A to 9C are sectional views showing a conventional method of forming a wiring pattern or an electrode pattern.

Referring to FIG. 9A, a wiring layer (or an electrode material layer) 7 is formed on an underlayer oxide film 8 which is formed on a wafer (not shown). A resist pattern 16 having a prescribed shape is formed on the wiring layer 7.

Referring to FIGS. 9A and 9B, the wiring layer 7 is dry-etched through the resist pattern 16 serving as a mask. At this time, a deposit 9 is formed along side walls of the resist pattern 16. This deposit 9 is formed by a mixture of material components of the wiring layer 7, a gas employed for the etching, and organic components of the resist pattern 16.

Referring to FIGS. 9B and 9C, the resist pattern 16 is removed by ashing employing an oxygen plasma or the like. At this time, the deposit 9 remains unremoved after the ashing. The deposit 9 causes short-circuiting or leakage across a wire and breaking of a contact part to extremely deteriorate performance of a semiconductor device, if the same is left intact.

In general, the deposit 9 is removed through a cleaning liquid, which is selected in response to the wiring material or the material for an electrode part.

As hereinabove described, the cleaning liquid is varied with the wiring material or the material for an electrode part.

When the wiring material is prepared from WSi or poly-Si, an aqueous ammonia hydrogen peroxide solution (APM) or an aqueous hydrogen fluoride solution is employed as the cleaning liquid. When the wiring material contains Al, this material is also etched in a large quantity if an aqueous acidic or alkaline solution is employed as the cleaning liquid. In order to avoid this, a cleaning liquid containing an organic solvent such as organic amine is employed in this case. However, this cleaning liquid also etches the wiring material (7) while removing the deposit 9. In general, the wiring layer 7 is disadvantageously extremely etched when a cleaning liquid which can readily remove the deposit 9 is employed. In formation of a fine wiring pattern, therefore, it is difficult to employ the aforementioned cleaning liquid.

When a capacitor is prepared from a high dielectric material, on the other hand, its electrode is prepared from a metal material having a high melting point, such as Pt having small reactivity, in particular. Thus, the deposit 9 inevitably contains Pt, and hence it is difficult to remove this deposit 9 through a chemical liquid. While the deposit 9 can be removed through aqua regia, the electrode material (7) is also etched in this case. In formation of a fine electrode pattern, therefore, it is difficult to employ this method.

While there has also been proposed a cleaning method employing high pressure injection (a jet scrubber), the detergency is so small that the deposit 9 cannot be completely removed.

SUMMARY OF THE INVENTION

The present invention has been proposed to solve the aforementioned problems, and an object thereof is to provide a post-treatment method for dry etching, which is improved to be capable of completely removing a deposit formed along side walls of a resist pattern.

Another object of the present invention is to remove a deposit which is formed along side walls of a resist pattern without damaging a wiring pattern.

Still another object of the present invention is to provide a post-treatment method for dry etching, which is improved to be capable of removing a deposit without etching a wiring pattern.

In a post-treatment method for dry etching according to a first aspect of the present invention, a workpiece layer is first formed on a wafer. A resist pattern having a prescribed shape is formed on the workpiece layer. The workpiece layer is dry-etched through the resist pattern serving as a mask. The resist pattern is removed. Ice particles are injected toward the wafer.

In a post-treatment method for dry etching according to a second aspect of the present invention, a workpiece layer is first formed on a wafer. A resist pattern having a prescribed shape is formed on the workpiece layer. The workpiece layer is dry-etched through the resist pattern serving as a mask. The resist pattern is removed. Droplets are injected toward the wafer.

In the post-treatment method for dry etching according to the first aspect of the present invention, ice particles are injected toward the wafer, whereby a deposit which is formed along side walls of the resist pattern is blown off and removed by a pressure applied by the ice particles.

In the post-treatment method for dry etching according to the second aspect of the present invention, droplets are injected toward the wafer, whereby a deposit which is formed along side walls of the resist pattern is blown off and removed by a pressure applied by the droplets.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

Embodiment 1

FIGS. 1A to 1D are sectional views showing a method of fabricating a semiconductor device employing a post-treatment method for dry etching according to an embodiment 1 of the present invention.

Figure 1A:
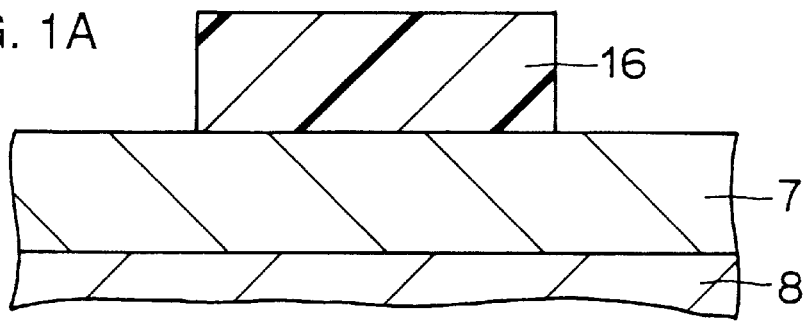
FIGS. 1A to 1D are sectional views showing steps of a post-treatment method for dry etching according to an embodiment 1 of the present invention.

Referring to FIG. 1A, a workpiece layer 7 is formed on an underlayer oxide film 8 which is formed on a wafer (not shown). A resist pattern 16 having a prescribed shape is formed on the workpiece layer 7. The workpiece layer 7 is described later in detail.

Figure 1B:
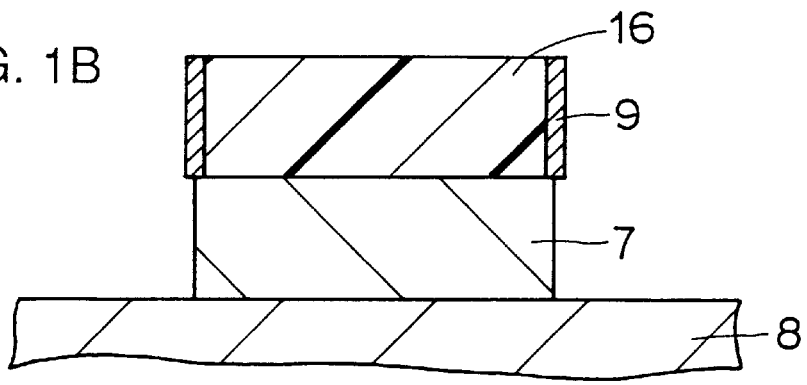

Referring to FIGS. 1A and 1B, the workpiece layer 7 is dry-etched through the resist pattern 16 serving as a mask. Thus, a pattern of the workpiece layer 7 is formed. At this time, a deposit 9 consisting of a mixture of components of the workpiece layer 7 and organic components of the resist pattern 16 is formed along side walls of the resist pattern 16.

Figure 1C:
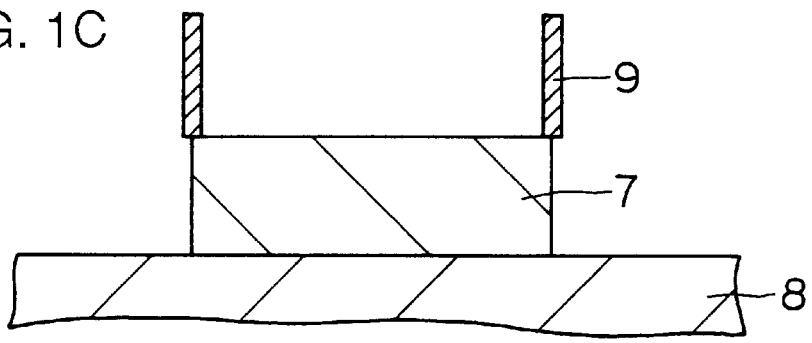

Referring to FIGS. 1B and 1C, the resist pattern 16 is removed. At this time, the upwardly extending deposit 9 remains on the workpiece layer 7.

Figure 1D:
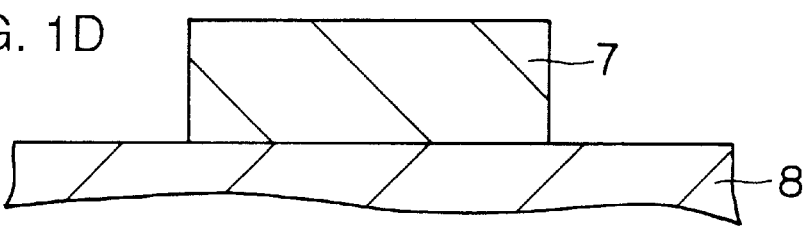

Referring to FIGS. 1C and 1D, ice particles or droplets are injected toward the wafer as described later with reference to FIG. 7, thereby removing the deposit 9.

Embodiment 2

FIGS. 2A to 2D are step diagrams showing the inventive method which is applied to formation of a contact hole in an interlayer insulating film.

Figure 2A:
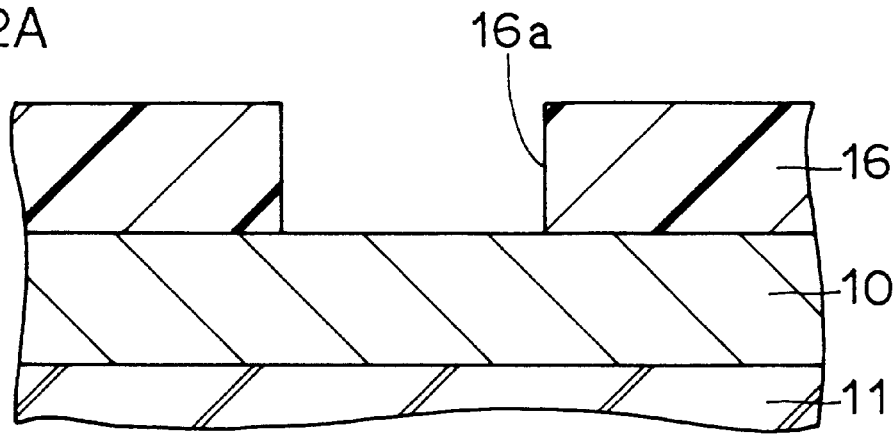
FIGS. 2A to 2D are sectional views showing steps of a post-treatment method for dry etching according to an embodiment 2 of the present invention.

Referring to FIG. 2A, an interlayer insulating film 10 is formed on a contact material layer 11 which is formed on a wafer (not shown). A resist pattern 16 having a prescribed opening 16a is formed on the interlayer insulating film 10.

Figure 2B:
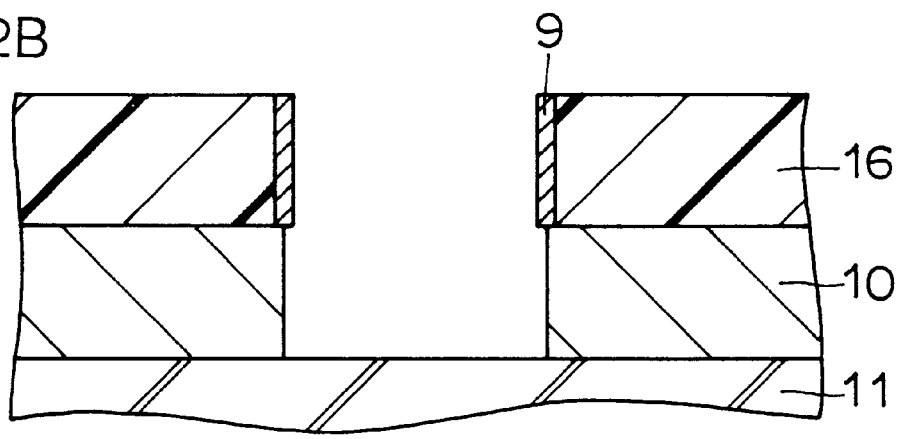

Referring to FIGS. 2A and 2B, the interlayer insulating film 10 is etched through the resist pattern 16 serving as a mask, to expose a surface of the contact material layer 11. At this time, a deposit 9 consisting of a mixture of components of the contact material layer 11 and the interlayer insulating film 10 and organic components of the resist pattern 16 is formed along inner side wall surfaces of the opening 16a of the resist pattern 16.

Figure 2C:
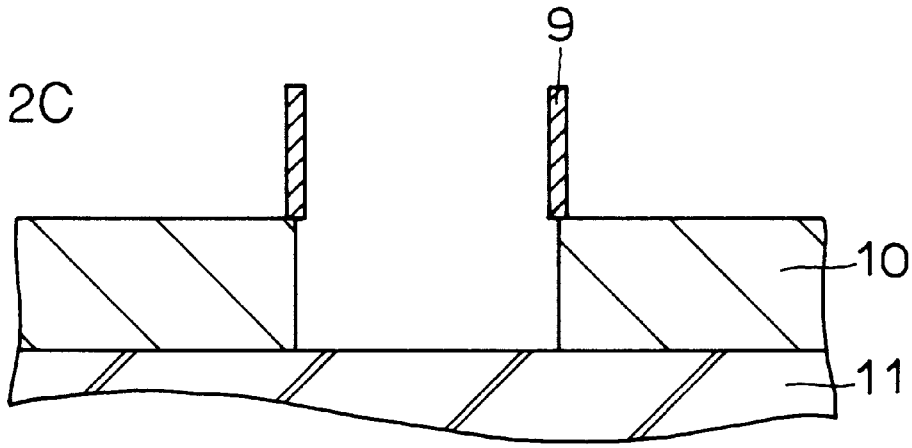

Referring to FIGS. 2B and 2C, the resist pattern 16 is removed. At this time, the vertically upwardly extending deposit 9 remains on the interlayer insulating film 10.

Figure 2D:
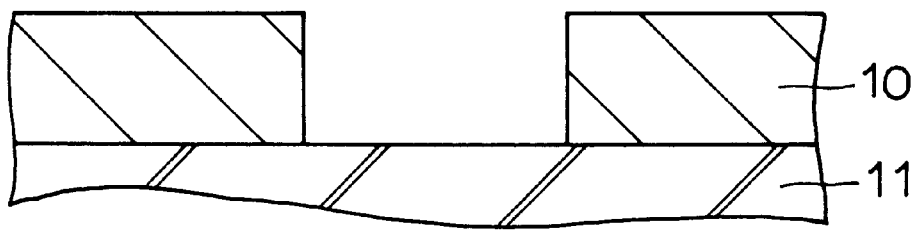

Referring to FIGS. 2C and 2D, ice particles or droplets are injected toward the wafer as described later with reference to FIG. 8, thereby removing the deposit 9.

Embodiment 3

Figure 3:
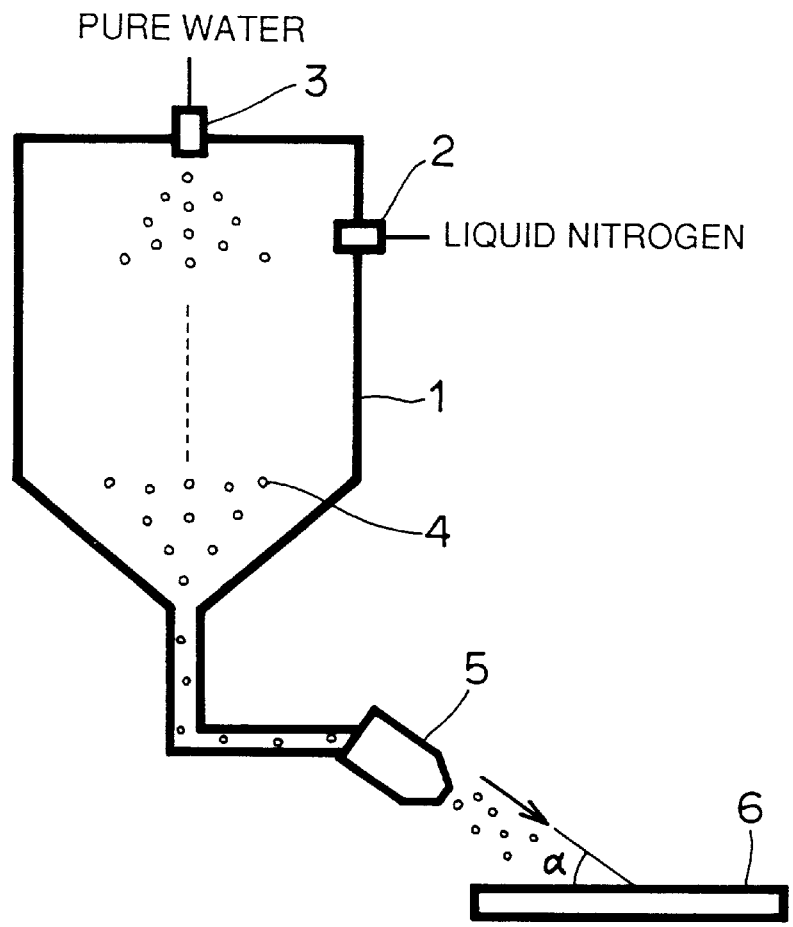
FIG. 3 is a conceptual diagram of ice scrubber cleaning.

FIG. 3 is a conceptual diagram showing ice scrubber cleaning according to an embodiment 3 of the present invention. An ice scrubber cleaning apparatus includes an ice making hopper 1 and an injection nozzle 5. The ice making hopper 1 is provided with a pure water spray nozzle 3 for spraying pure water into the ice making hopper 1. The ice making hopper 1 is also provided with a liquid nitrogen supply nozzle 2 for supplying liquid nitrogen into the ice hopper 1.

The operation of this apparatus is now described. Liquid nitrogen is supplied into the ice making hopper 1 from the liquid nitrogen supply nozzle 2, for cooling the interior of the ice making hopper 1 to about −130° C. At the same time, pure water is finely sprayed into the ice making hopper 1 from the pure water spray nozzle 3. At this time, the finely sprayed pure water is cooled in the ice making hopper 1, to form ice particles 4. The ice particles 4 can be controlled to 1 μm to 100 μm in particle size through the shape of the pure water spray nozzle 3 and the pressure for supplying the pure water. The injection nozzle 5 injects the ice particles 4 toward a surface of a wafer 6 by an ejector system employing a carrier gas. The injection rate for the ice particles 4 can be controlled to 50 m/sec. to 330 m/sec. through the shape of the injection nozzle 5 and the pressure of the carrier gas.

The cleaning effect of the ice scrubber cleaning depends on the particle sizes of the ice particles 4, the injection rate for the ice particles 4, and a collision angle (α) of the ice particles 4 with respect to the wafer 6. The collision angle is preferably 15° to 90°.

Figure 7:
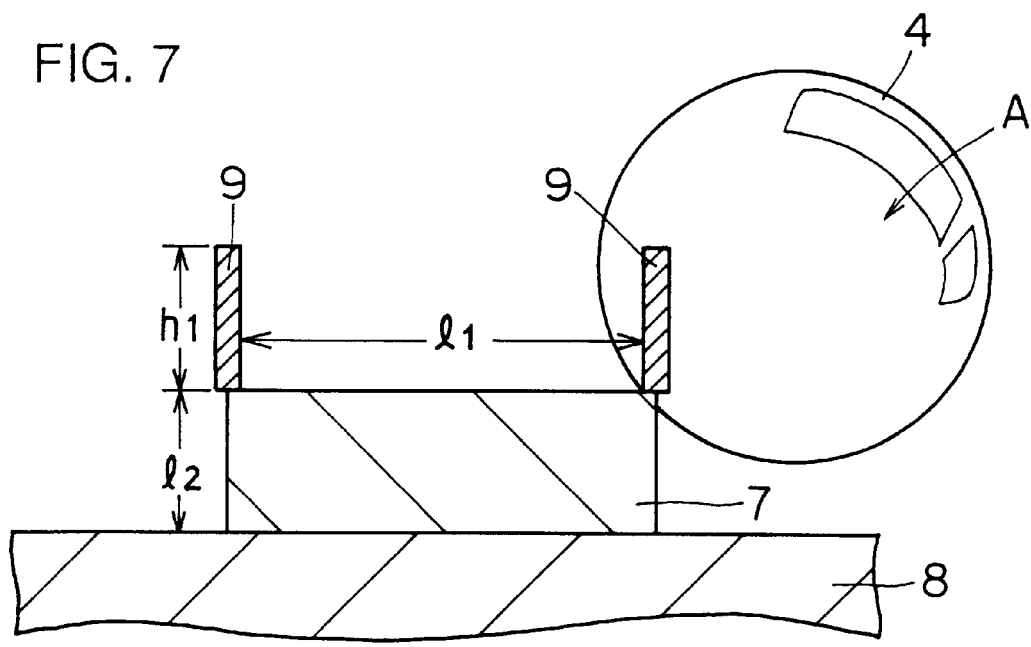
FIG. 7 is adapted to illustrate a functional effect of ice scrubber cleaning or pulse jet scrubber cleaning which is applied to a step of forming a wire or an electrode.

FIG. 7 is a sectional view showing a state of the ice scrubber cleaning which is applied after dry etching of a workpiece layer 7 (a wire or an electrode). Referring to FIG. 7, ice particles 4 are injected toward a wafer (not shown) from a direction shown by arrow A. An underlayer oxide film (or a high dielectric film) 8 is formed on the wafer, and a wire (or an electrode) 7 is formed on the underlayer oxide film 8, while a vertically upwardly extending deposit 9 remains on the wire 7. In general, the deposit 9 has a height $h_1$, which is equal to the thickness of a resist film, of 1 μm to 2 μm. The wire 7 has a width $I_1$ of at least 0.25 μm. Assuming that I2 represents the thickness of the wire 7 and the aspect ratio is expressed as $I_2/I_1$, the present invention can be suitably applied to a material having an aspect ratio of at least 1.

In the ice scrubber cleaning, the ice particles 4 collide with the wafer, to blow off and remove the deposit 9 from the wire 7 by the physical action.

Figure 8:
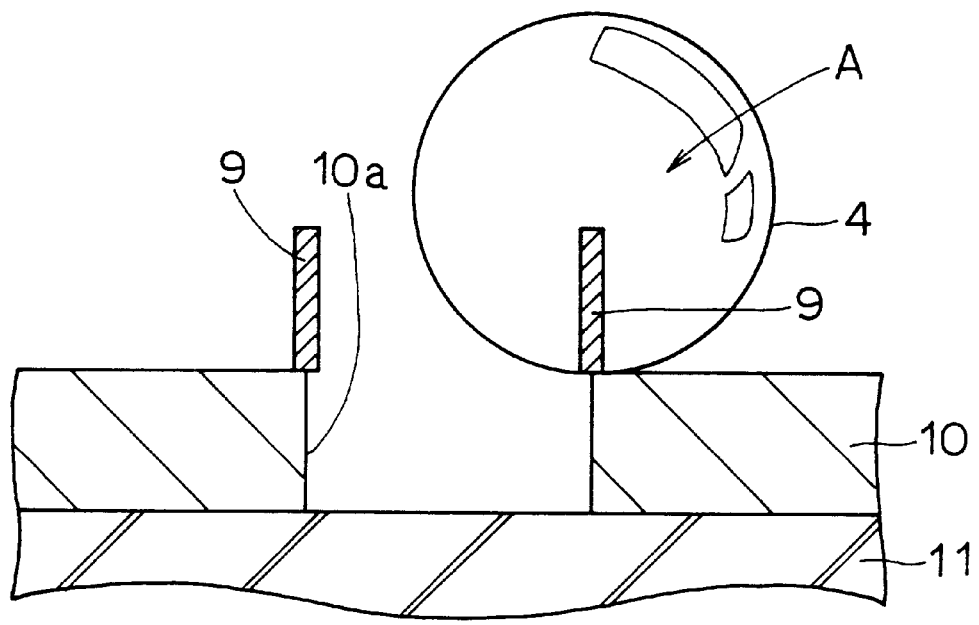
FIG. 8 is adapted to illustrate a functional effect of ice scrubber cleaning or pulse jet scrubber cleaning which is applied to formation of a hole in an interlayer insulating film.
Figure 9A:
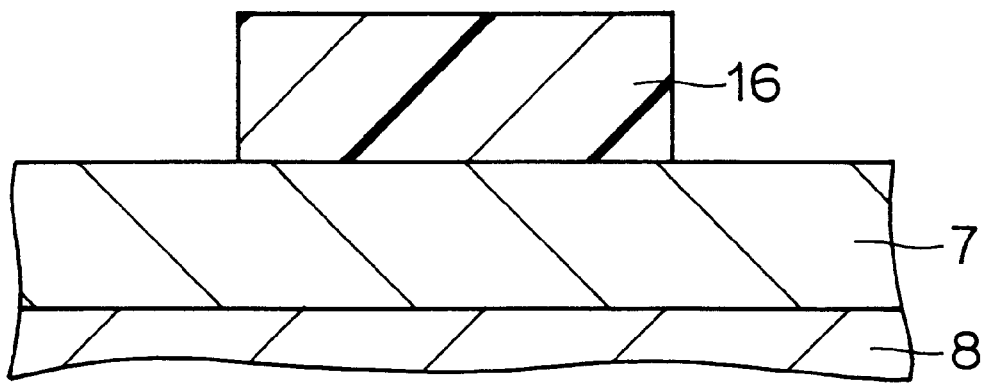
FIGS. 9A to 9C illustrate problems in a conventional method of forming a wire or an electrode by dry etching.
Figure 9B:
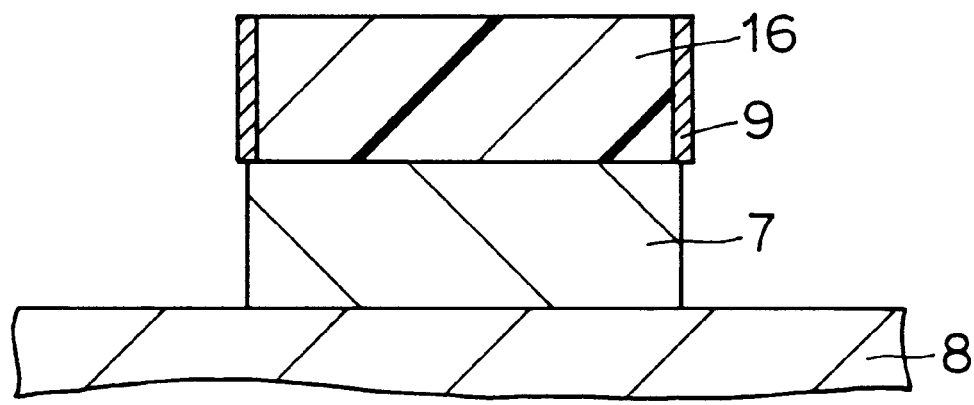
Figure 9C:
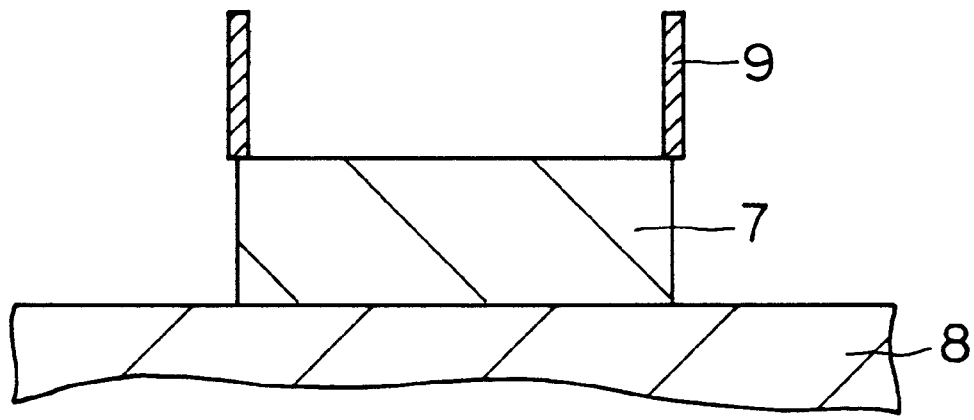

FIG. 8 shows a state of the ice scrubber cleaning which is applied after formation of a contact hole in an interlayer insulating film 10 by dry etching. Ice particles 4 collide with a wafer (not shown) from a direction shown by arrow A. A contact material layer 11 is formed on the wafer, and the interlayer insulating film 10 having a contact hole 10a is provided on the contact material layer 11. A vertically upwardly extending deposit 9 remains on the interlayer insulating film 10.

The ice particles 4 collide with the wafer, to blow off and remove the deposit 9 from the interlayer insulating film 10.

While FIGS. 7 and 8 illustrate states of the ice scrubber cleaning, similar figures can be drawn also in the case of pulse jet scrubber cleaning described later. In this case, the ice particles are replaced by droplets.

Embodiment 4

Figure 4:
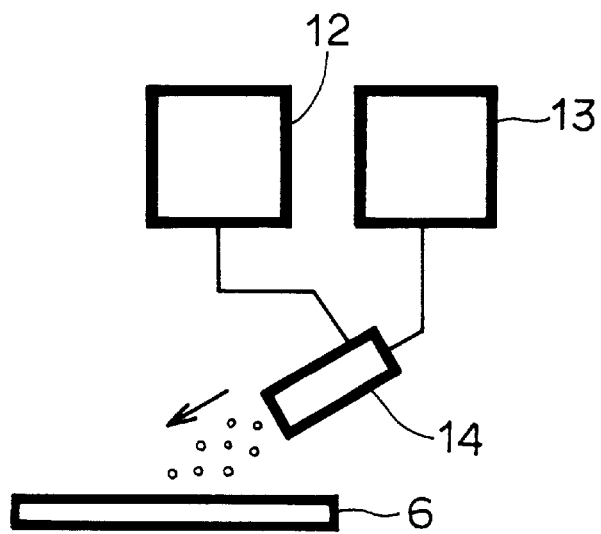
FIG. 4 is a conceptual diagram of pulse jet scrubber cleaning.
Figure 5:
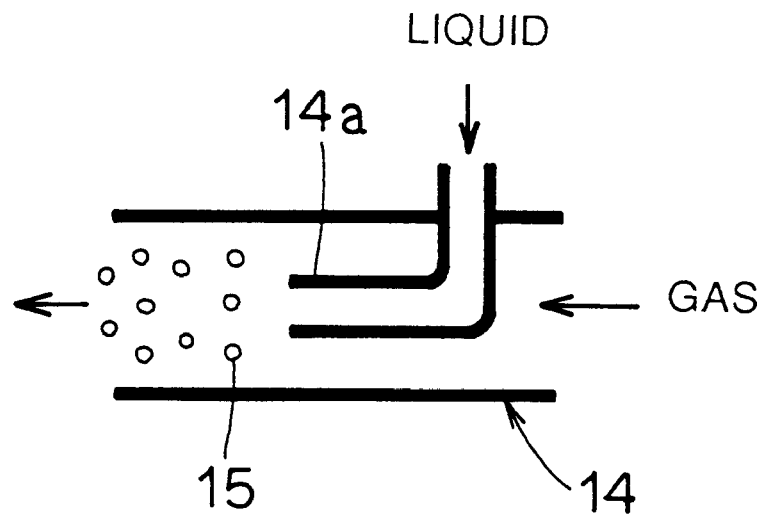
FIG. 5 is a conceptual diagram showing the internal structure of a pulse jet nozzle.

FIG. 4 is a conceptual diagram showing pulse jet scrubber cleaning which is applied to the present invention. A pulse jet scrubber cleaning apparatus includes a liquid supply tank 12, a gas supply tank 13, and a pulse jet nozzle 14. FIG. 5 is a conceptual diagram showing the internal structure of the pulse jet nozzle 14. Referring to FIGS. 4 and 5, a pressurized liquid is supplied from the liquid supply tank 12 into the pulse jet nozzle 14, while a pressurized gas is supplied from the gas supply tank 13 into the pulse jet nozzle 14. The liquid and the gas are mixed with each other in the pulse jet nozzle 14 to form droplets 15, which in turn are injected toward a wafer 6.

The particle sizes of the droplets 15 are decided by the shape of the pulse jet nozzle 14, particularly the diameter of a pipe 14a forming a liquid outlet port, and the supply pressures for the liquid and the gas. Thus, the particle sizes of the droplets 15 can be controlled to 1 $\mu$m to 200 $\mu$m.

Figure 6:
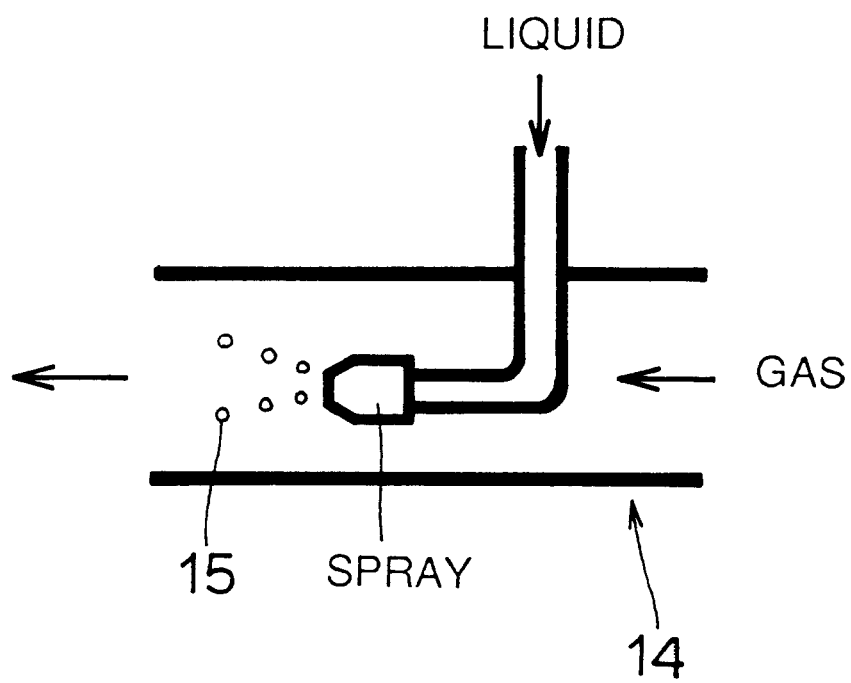
FIG. 6 is a conceptual diagram showing another concrete example of a pulse jet nozzle.

While the liquid outlet port of the pulse jet nozzle 14 is in the form of a circular pipe in FIG. 5, a spray nozzle shown in FIG. 6 may alternatively be employed. When the spray nozzle shown in FIG. 6 is employed, particle sizes of the droplets 15 can be homogenized and controlled to 1 m to 100 $\mu$m through the shape of the spray nozzle and the liquid supply pressure.

The injection rate for the droplets 15 can be controlled to 1 m/sec. to 330 m/sec. through the supply pressure of the gas supply tank 13. The cleaning effect of the pulse jet scrubber cleaning depends on the particle sizes of the droplets 15, the injection rate for the droplets 15, the collision angle of the droplets 15 with respect to the wafer 6, and physical properties of the liquid such as the density. The physical properties of the liquid are varied with its temperature. When pure water is employed, the most excellent cleaning effect is attained at a temperature of 4° C. maximizing the density, while a preferable effect is attained in the range of 4° C. to 25° C. When a reactive chemical other than pure water is employed, the temperature is preferably controlled to 20° C. to 100° C.

The effects of the ice scrubber cleaning and the pulse jet scrubber cleaning are now described in comparison.

The ice scrubber cleaning further improves the effect of removing the deposit as compared with the pulse jet scrubber cleaning, due to the difference between physical properties of ice and a liquid. When the structure of the wire or the electrode is refined to increase the aspect ratio, however, the ice scrubber cleaning may damage the wire or the electrode. While the pulse jet scrubber cleaning is slightly inferior in detergency to the ice scrubber cleaning, the droplet injection rate which remarkably influences the cleaning effect and the degree of damage can be controlled in a wide range, whereby optimum cleaning conditions can be found in consideration of the effect of removing the deposit and the damage.

Embodiment 5

This embodiment relates to the type of the liquid which is employed for the pulse jet scrubber cleaning. It is possible to further improve the effect of removing the deposit by varying the type of the liquid with the applied step. Namely, the chemical liquid reacts with the deposit to first attain a state capable of readily separating the deposit from the wafer, and then a physical action is applied by collision of the droplets. The deposit can be effectively removed by a synergetic effect of these actions.

Applied steps and exemplary chemical liquids suitable therefor are now described.

Embodiment 6

An embodiment 6 relates to the type of a liquid which is suitably employed in a step of forming a wire or an electrode. In case of a wiring material containing Al, droplets which are made of organic amine, alcohol, an organic solvent containing a quaternary ammonium hydroxide, or water containing a quaternary ammonium hydroxide provide a preferable cleaning effect.

In case of a wiring material containing WSi or poly-Si, droplets which are made of an aqueous ammonia hydrogen peroxide solution or an aqueous hydrogen fluoride solution provide a preferable cleaning effect.

In case of an electrode material of Pt etc. which is employed for a high dielectric substance, droplets which are made of alcohol, or a solution prepared by adding a quaternary ammonium hydroxide to alcohol provide a preferable cleaning effect.

In case of a wiring material containing Ti or TiN, droplets which are made of an aqueous hydrogen peroxide solution, an aqueous hydrogen fluoride solution, organic amine, alcohol, or an organic solvent containing a quaternary ammonium hydroxide provide a preferable cleaning effect.

Embodiment 7

This embodiment relates to decision of a preferable material for droplets for removing a deposit resulting from a step of forming a contact hole in an interlayer insulating film.

When the contact material contains Al, droplets which are made of organic amine, alcohol or an organic solvent containing a quaternary ammonium hydroxide provide a preferable cleaning effect.

It has been discovered that, when the contact material contains WSi or poly-Si., droplets which are made of an aqueous ammonia hydrogen peroxide solution or an aqueous hydrogen fluoride solution provide a preferable cleaning effect.

It has been discovered that, when the contact material contains Ti or TiN, droplets which are made of an aqueous hydrogen peroxide solution, an aqueous hydrogen fluoride solution, organic amine, alcohol, or an organic solvent containing a quaternary ammonium hydroxide provide a preferable cleaning effect.

Embodiment 8

This embodiment relates to selection of a material serving as an object of dry etching to which the present invention is applied.

A wiring material is preferably prepared from Al or an Al alloy such as AlSi, AlSiCu or AlCu, Ti, TiN, TiW, a multilayer film of an Al alloy and Ti, TiN or TiW, W, Cu, poly-Si or Wsi.

When a capacitor is prepared from a material having a high dielectric constant such as tantalum oxide ($Ta_2O_5$), lead zirconate titanate (PZT), lead lanthanum zirconate titanate (PLZT), strontium titanate (STO), barium titanate (BTO) or barium strontium titanate (BSTO), for example, in a recent LSI, an electrode is prepared from a material having extremely small chemical reactivity. Examples of such an electrode material are metals having high melting points and oxides thereof such as platinum (Pt), a platinum alloy, ruthenium (Ru), ruthenium oxide ($RuO_2$), iridium (Ir) and an Ni alloy. The present invention can be preferably applied also to such materials.

In dry etching for forming a hole (a contact hole or a through hole) in an interlayer insulating film, a silicon oxide film is etched to expose the contact material in the bottom of the hole. Examples of the contact material exposed on the bottom of the hole are Al or an Al alloy such as AlSi, AlSiCu or AlCu, Ti, TiN, WSi, poly-Si, W, Cu, $CoSi_2$ and Si, the present invention provides an excellent cleaning effect in case of such materials.

In the post-treatment method for dry etching according to the first aspect of the present invention, as hereinabove described, ice particles are injected toward the wafer, whereby the deposit formed along the side walls of the resist pattern is blown off and removed by the pressure applied by the ice particles. Consequently, the deposit can be effectively removed without etching a wiring pattern etc.

In the post-treatment method for dry etching according to the second aspect of the present invention, droplets are injected toward the wafer, whereby the deposit formed along the side walls of the resist pattern is blown off and removed by the pressure applied by the droplets. Consequently, the deposit can be effectively completely removed without damaging a wiring pattern.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A post-treatment method for dry etching, comprising the steps of:

forming a workpiece layer containing Pt or Ru on a wafer;

forming a resist pattern having a shape on said workpiece layer;

dry etching said workpiece layer through said resist pattern on a mask;

removing said resist pattern;

forming droplets which are made of alcohol or water containing a quaternary ammonium hydroxide and which are uniform in particle size, using a pulse jet nozzle; and jetting said droplets which are uniform in particle size toward said wafer.

2. The post-treatment method for dry etching as in any one of claim 1, wherein said droplets are jetted at a rate of 1 m/sec. to 330 m/sec.

3. The post-treatment method for dry etching as in any one of claim 1, wherein said droplets are 1 $\mu$m to 100 $\mu$m in particle size.

4. The post-treatment method for dry etching as in any one of claim 1, wherein said droplets are controlled to be at 20° C. to 100° C. in temperature.

5. A post-treatment method for dry etching, comprising the steps of:

forming a workpiece layer containing Pt, Ru, or Al on a wafer;

forming a resist pattern having a shape on said workpiece layer;

dry etching said workpiece layer through said resist pattern on a mask;

removing said resist pattern;

forming droplets which are made of water and which are uniform in particle size, using a pulse jet nozzle; and jetting said droplets which are uniform in particle size toward said wafer.

6. A post-treatment method of dry etching in accordance with claim 1, comprising the further step of controlling the droplet injection rate in consideration of the effect of removing deposit from the wafer and damage to the wafer.

7. A post-treatment method of dry etching in accordance with claim 1, wherein said droplet is a particle.

8. A post-treatment method of dry etching in accordance with claim 6, wherein the droplet injection rate is controlled to substantially 330 m/sec.

9. A post-treatment method for dry etching in accordance with claim 1, wherein said workpiece layer after said dry etching has a width $I_1$ and a thickness $I_2$, and wherein the aspect ratio ($I_2/I_1$) is at least 1.

10. A post-treatment method of dry etching in accordance with claim 9, wherein said workpiece layer after said dry etching has width $I_1$ of at least 0.25 $\mu$m.

11. A post-treatment method for dry etching in accordance with claim 5, comprising the further step of controlling the droplet injection rate in consideration of the effect of removing deposit from the wafer and damage to the wafer.

12. A post-treatment method for dry etching in accordance with claim 5, wherein said droplet is a particle.

13. A post-treatment method for dry etching in accordance with claim 11, wherein the droplet injection rate is controlled to substantially 330 m/sec.

14. A post-treatment method for dry etching in accordance with claim 5, wherein said workpiece layer after said dry etching has a width $I_1$ and a thickness $I_2$, and wherein the aspect ratio ($I_2/I_1$) is at least 1.

15. A post-treatment method for dry etching in accordance with claim 14, wherein said workpiece layer after said dry etching has a width $I_1$ of at least 0.25 $\mu$m.

* * * * *